United States Patent [19]
Masuta

[11] Patent Number: 5,874,842
[45] Date of Patent: Feb. 23, 1999

[54] SAMPLE AND HOLD CIRCUIT HAVING QUICK RESETTING FUNCTION

[75] Inventor: Tomoaki Masuta, Tokyo, Japan

[73] Assignee: NEC Corporation, Tokyo, Japan

[21] Appl. No.: 914,067

[22] Filed: Jul. 15, 1997

[30] Foreign Application Priority Data

Jul. 16, 1996 [JP] Japan ................................. 8-186000

[51] Int. Cl.⁶ .................................................. G11C 27/02
[52] U.S. Cl. ............................................. 327/96; 327/95
[58] Field of Search ................................ 327/91, 93–97,
327/65, 67, 73, 90, 561–563, 374–377,
392, 379, 383; 341/122–125

[56] References Cited

U.S. PATENT DOCUMENTS

| | | | |
|---|---|---|---|
| 3,363,113 | 1/1968 | Bedingfield | 327/95 |
| 3,686,577 | 8/1972 | Fruhauf | 327/95 |
| 3,701,909 | 10/1972 | Holmes et al. | 327/95 |
| 4,445,093 | 4/1984 | Kohler | 327/58 |
| 4,585,956 | 4/1986 | Lie | 327/95 |
| 4,588,954 | 5/1986 | Seymour | 327/95 |

FOREIGN PATENT DOCUMENTS 90009023 8/1990 WIPO ...................................... 327/95

*Primary Examiner*—My-Trang Nu Ton
*Attorney, Agent, or Firm*—Scully, Scott, Murphy & Presser

[57] ABSTRACT

A diode for passing the output of a differential amplifier to a holding capacitor is short-circuited in response to a first switching signal, thereby causing the holding capacitor to be discharged through the short-circuiting circuit under control of a second switching signal. The first and second switching signals are generated by delaying a reset signal. The first switching signal is terminated before the termination of the second switching signal.

5 Claims, 4 Drawing Sheets

SAMPLE AND HOLD CIRCUIT HAVING QUICK RESETTING FUNCTION

BACKGROUND OF THE INVENTION

The present invention relates to a peak-holding circuits which is used for burst communication and provide the detected maximum input signal voltage as an output signal and, more particularly, to a peak-holding circuit for burst communication, which has a quick resetting function and a highly accurate peak-holding function and is obtainable by providing slight additional means to a MOS semiconductor integrated circuit.

In the burst communication, the maximum or minimum level of an input signal which varies with time is usually detected and held for a predetermined period of time. To this end, the peak-holding circuit should have a quick follow-up property for quickly following up the input signal level, as well as ensuring low hold error, i.e., being capable of holding the detected level without being lost by such cause as natural discharge. Furthermore, the peak-holding circuit should have a quick resetting function, that is, it should be able to immediately detect a new input signal. In order to meet these requirements, there have been proposed various peak-holding circuits for burst communication.

FIG. 4 shows a peak-holding circuit according to a prior art circuits.

This peak-holding circuit comprises a differential amplifier 10 having a normal phase input terminal 1, to which an input signal S1 is coupled, and an opposite phase input terminal, to which an output signal from an output terminal 2 is coupled, a forward diode 20 for passing the output of the differential amplifier 10, a holding capacitor 30 for holding the maximum level of the output that is passed, and a buffer 40 for making the maximum level to be an output signal while feeding back the maximum level to the differential amplifier 10.

A short-circuiting switch 50 is provided in parallel with the holding capacitor 30 such that it can be turned on by a reset signal S3. The short-circuiting switch 50 and the holding capacitor 30 are grounded at their terminals opposite the diode 20.

The normal peak-holding function is provided by turning off the short-circuiting switch 50. When the level of the input signal S1 is increased in this state, the diode 20 is turned on to cause current into the holding capacitor 30. The charging is continued until the levels of the differential amplifier output and the input signal become equal.

The terminal voltage across the holding capacitor 30 is detected by the buffer as a voltage level with respect to the ground, and constitutes an output voltage of the peak-holding circuit.

With subsequent level reduction of the input signal S1 the diode 20 is turned off, whereby the holding capacitor 30 holds the charge therein to hold the maximum level of the input signal S1.

For newly detecting the input signal S1, the holding capacitor 30 is discharged with the short-circuiting circuit 50 turned on in response to the input of a reset signal S2 thereto, thus resetting the maximum level that has been held and becoming ready for holding the next maximum level. Where the short-circuiting switch 50 is of MOS semiconductor so that it is low in price and consumes low power for carrying current, the holding capacitor 30 is discharged with a time constant, which is determined by the conduction resistance R50 of the short-circuiting switch 50 when current is carried thereby and the capacitance C30 of the holding capacitor 30.

In this case, time T necessary until the discharging up to 99% of the capacitance C30 is roughly given as:

$$T = 5 \times R50 \times C30 \qquad (1)$$

It will be seen that for realizing the above quick resetting function it is necessary to set the conduction resistance R50 and/or the capacitance C30 to be low.

The quick resetting function will be considered in detail by using an example.

The capacitance C30 of the holding capacitor 30 is usually 10 to 1 [pF], and is assumed here to be 10 [pF].

When it is also assumed that the holding capacitor 30 holds a voltage of 1 [V] across it and is discharged in 50 nsec., the resistance R50 is 1 [kΩ] from equation (1).

In order to realize this conduction resistance R50 of 1 [kΩ], in a recent 0.7 [μm] semiconductor process, for instance, a gate width of approximately 50 [μm] is required as the transistor size, and in this case the gate-drain parasitic capacitance C50 is usually approximately 0.005 [pF].

When the quick resetting function is to be realized in a MOS semiconductor integrated circuit by using a prior art peak-holding circuit for burst communication, however, the following problems are encountered.

In the first place, the charge Q50 that is withdrawn from the holding capacitor 30 for charging the parasitic capacitor C50 when releasing the reset signal, is given by equation (2) given below, and is $0.025 \times 10^{-12}$ Coulombs when the supply voltage VDD is 5 V.

$$Q50 = C50 \times VDD = 0.005 \times 10^{-12} \times 5 \qquad (2)$$

When the charge Q30 is accumulated in the holding capacitor 30, the above hold error E with respect to this charge Q30 is thus given by equation (3) given below. For example, assuming that the minimum voltage held across the holding capacitor 30 is 10 mV, the charge accumulated at this time is $0.1 \times 10^{-12}$ Coulombs. In this case, the hold error E is 25% at the maximum and cannot be ignored.

$$E = Q50/Q30 = 0.025 \times 10^{-12} \times 5 \qquad (3)$$

Secondly, in order to reduce the conduction resistance R50 of the short-circuiting switch 50, it is necessary to increase the size of the MOS semiconductor transistor of the switch. By increasing the transistor size, however, the gate-drain parasitic capacitance C50 is also increased, so that the hold error E is increased by noise based on the parasitic capacitance C50 at the time of the switching.

SUMMARY OF THE INVENTION

The invention has been made in view of the above problems, and its object is to provide a peak-holding circuit for burst communication, which is formed on a semiconductor integrated circuit and permits a quick resetting function and a highly accurate peak-holding function with slight additional means.

According to an aspect of the present invention, there is provided a peak-holding circuit for burst communication comprising a differential amplifier having a normal phase input terminal with an input signal coupled thereto and an opposite phase input signal with an output signal coupled thereto, a forward diode for passing the output of the differential amplifier, a holding capacitor for holding the maximum level of the output signal passed through the diode with respect to the ground, a buffer for feeding back the maximum level that is held to the differential amplifier while providing the same as the output signal, a first switching means connected in parallel with the diode and to be turned on by a first switching signal for short-circuiting the diode, and a second switching means connected between the differential amplifier and the diode and to be turned on by a second switching signal for short-circuiting the holding capacitor via the first switching means.

With this peak-holding circuit, the first switching means is turned on in response to the first switching signal to short-circuit the diode, and the second switching means is turned on in response to the second switching signal to short-circuit the holding capacitor via the first switching means.

The peak-holding circuit further comprises timing signal generating means for generating a first and a second switching signal by receiving a reset signal and outputting these generated signals to the first and second switching means, respectively.

With this peak-holding circuit, the timing signal generating means generates the first and second switching signals by receiving the reset signal and outputs these generated signals to the first and second switching means, respectively.

The timing signal generating means includes a first delay circuit for generating the first switching signal by delaying the reset signal, and a second delay circuit for generating the second switching signal by delaying the reset signal. The timing signal generating means generates the first and second switching signals such that the first switching signal is terminated before the termination of the second switching signal.

With this peak-holding circuit, the first and second delay circuits generate first and second switching signals by delaying the reset signal.

The timing signal generating means generates the first and second switching signals such that the first switching signal is terminated before the termination of the second switching signal.

With this peak-holding circuit, the first switching signal is terminated before the termination of the second switching signal.

According to another aspect of the present invention, there is provided a peak-holding circuit for burst communication comprising a differential amplifier having a normal phase input terminal with an input signal coupled thereto and an opposite phase input signal with an output signal coupled thereto, a forward diode for passing the output of the differential amplifier, a holding capacitor for holding the maximum level of the output signal passed through the diode with respect to the ground, a first switching means connected in parallel with the diode and to be turned on by a first switching signal for short-circuiting the diode, and a second switching means connected between the differential amplifier and the diode and to be turned on by a second switching signal for short-circuiting the holding capacitor via the first switching means, the first and second switching signals being produced by delaying a reset signal and the first switching signal being terminated before the termination of the second switching signal.

Other objects and features will be clarified from the following description with reference to attached drawings.

PREFERRED EMBODIMENTS OF THE INVENTION

Figure 1:
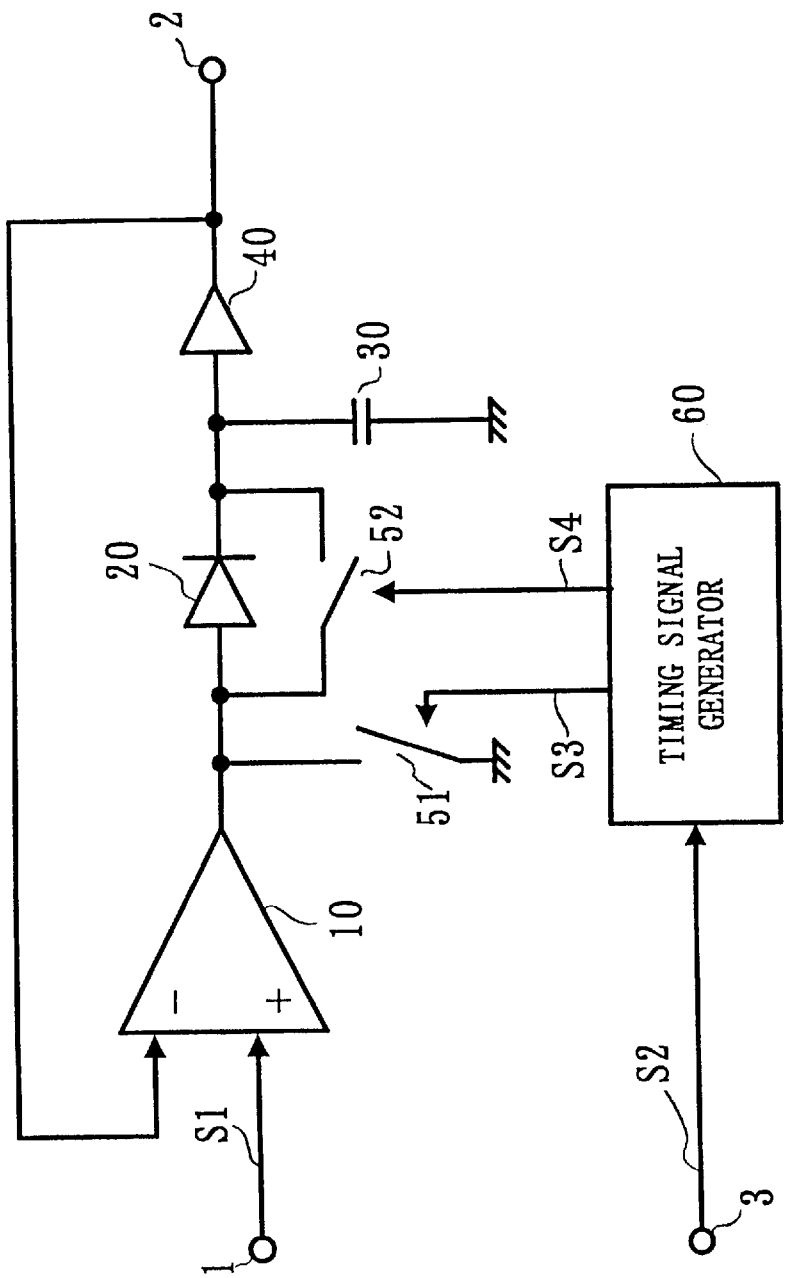
FIG. 1 is a schematic showing of an embodiment of the present invention.

FIG. 1 is a schematic showing of an embodiment of the present invention. Parts with functions like those in the prior art example are designated by like reference numerals and not described in detail.

The embodiment comprises a first switching means 51 for short-circuiting a diode 20, and a second switching means 52 for causing discharge of a holding circuit 30 through the first switching means 51.

Figure 4:
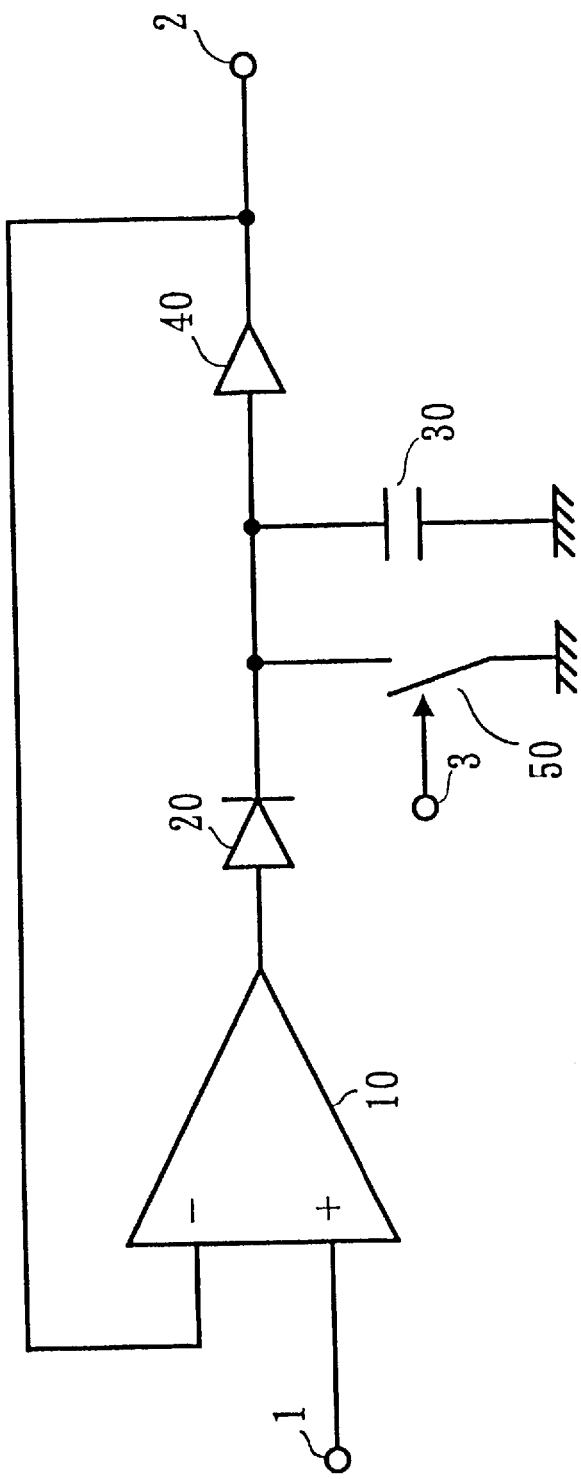
FIG. 4 shows a prior art peak-holding circuit.

A timing signal generating means 60 generates signals for controlling the timings of switching of the first and second switching means 51 and 52. For the remainder of the construction, this embodiment is the same as the prior art peak-holding circuit shown in FIG. 4.

The timing signal generating means 60 receives a reset signal S2, and generates a first and a second signals S3 and S4 which are sent out to the first and second switching means 51 and 52, respectively.

The first switching means 51 is connected in parallel with the diode 20, and it is turned on by the first switching signal S3 to short-circuit the diode 20.

The second switching means 51 is connected between a differential amplifier 10 and the diode 20, and it is turned on and grounded by the second switching signal 52 to short-circuit the peak-holding capacitor 30 via the first switching means 51.

Figure 2:
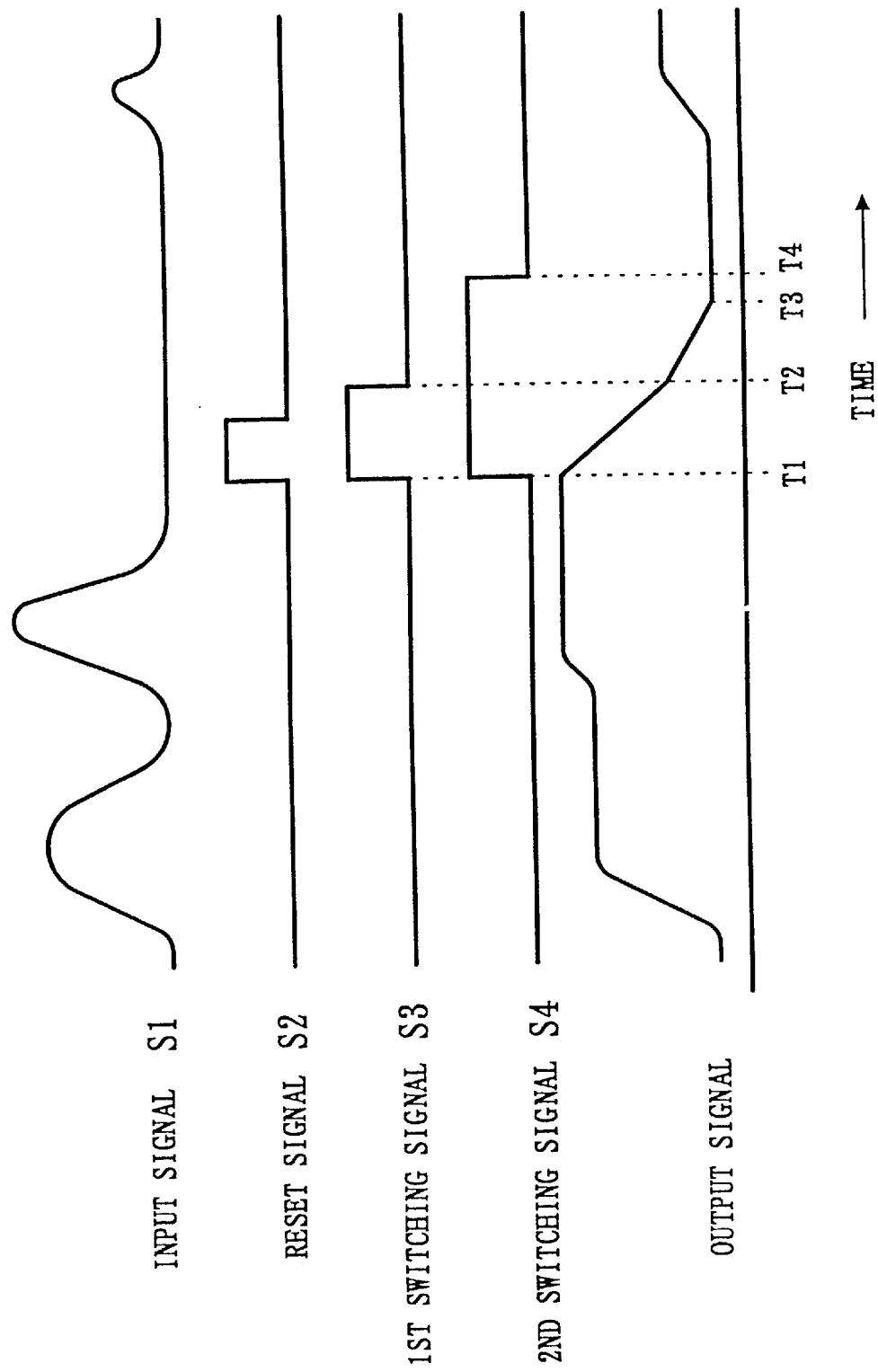
FIG. 2 is a waveform chart for describing various parts shown in FIG. 1.

FIG. 2 is a waveform chart for describing various parts shown in FIG. 1.

In the figure, an input signal S1 is an analog signal in burst communication, the voltage level of which varies with time.

The reset signal S2 can take a low and a high logic level "L" and "H". When it is at the level "L", a first and a second switching signal S3 and S4 are both held at "L" until an instant T1.

Up to this instant, the first and second switching means 51 and 52 are "off", and this peak-holding circuit, like the prior art one, can provide the peak-holding function.

With the inversion of the reset signal S2 to "H", a novel resetting function according to the present invention will be described.

At the instant T1, the first and second switching signals S3 and S4 are both inverted to the level "H", whereupon the first and second switching means 51 and 52 are both turned on. As a result, the holding capacitor 30 is grounded through the first and second switching means 51 and 52 and immediately begins to be discharged so that its potential is quickly reduced.

The timing signal generating means 60 includes a first and a second delay circuit 61 and 62 (FIG. 3), which generate the first and second switching signals S3 and S4, respectively, by delaying the reset signal S2.

The first switching signal S3 is terminated before the termination of the second switching signal S4.

When the delay time provided by the first delay circuit 61 is elapsed at an instant T2, the first switching signal S3 is inverted to the level "L". As a result, the discharging of the holding capacitor 30 becomes slower, that is, the output signal level slope thereof becomes gentler. The discharging is ultimately all over at an instant T3.

When the delay time provided by the second delay circuit 62 is elapsed at a subsequent instant T4, the second switching signal S4 is also inverted to the level "L", and the peak-holding circuit can restore the above peak-holding function.

Figure 3:
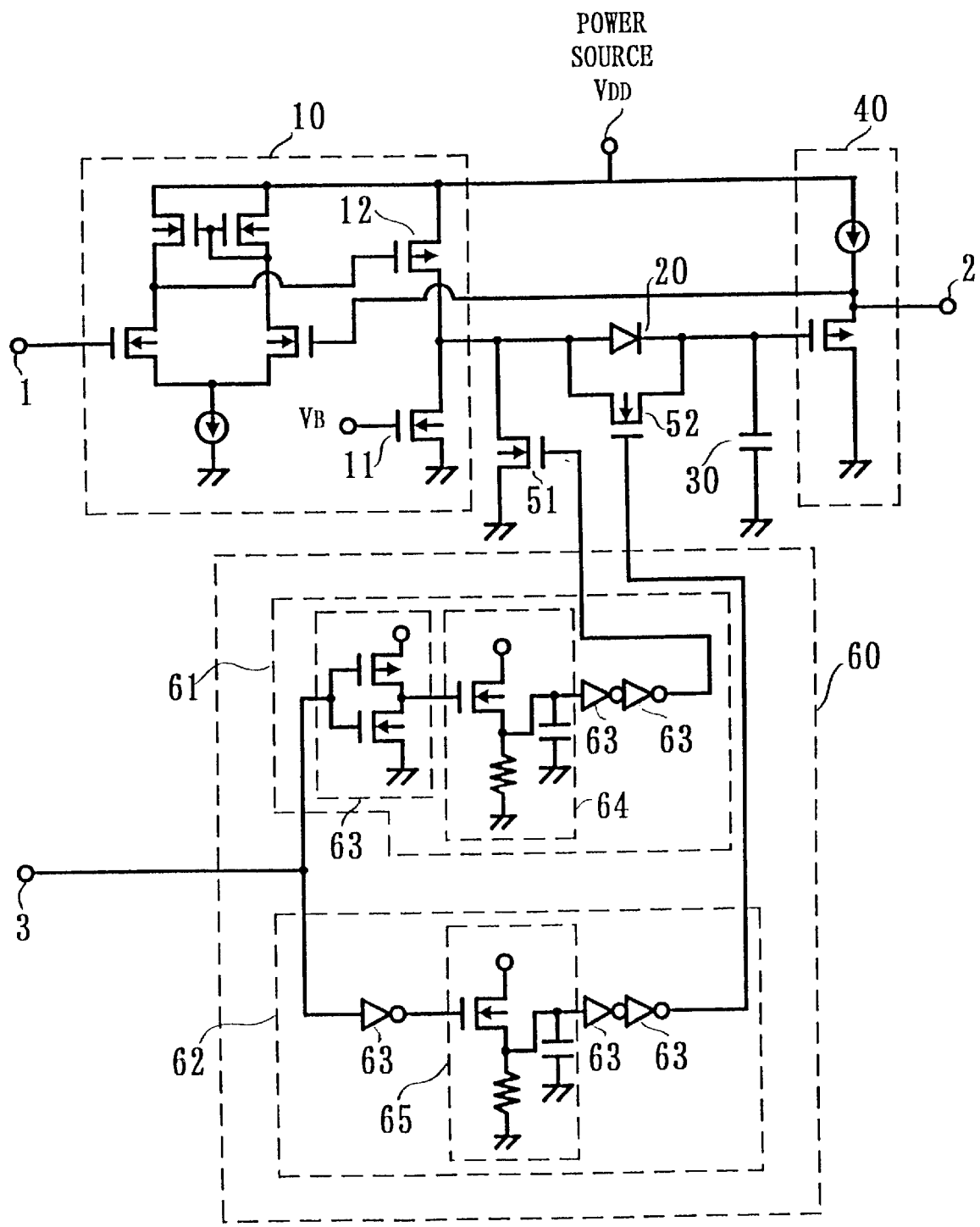
FIG. 3 is a circuit diagram for describing the construction of various parts shown in FIG. 1.

FIG. 3 is a circuit diagram for describing the construction of various parts shown in FIG. 1.

As shown in FIG. 3, the differential amplifier 10 includes an input stage constituted by a differential circuit and an output stage constituted by an amplifier circuit. The first and second switching means 51 and 52 are each constituted by an N-channel MOS FET (these switching means being hereinafter referred to as first and second FETs 51 and 52, respectively). The buffer 40 is constituted by an n-channel MOS FET connected as a source follower.

The differential circuit as the input stage has a normal phase input terminal 1, to which the input signal S1 is coupled, and an opposite phase input terminal, to which the output signal from the output terminal 2 of the buffer 40 is coupled.

The amplifier circuit as the output stage has an N-channel MOS FET (hereinafter referred to as third FET) 11 which has the source grounded and the gate biased to a predetermined potential, and a P-channel MOS FET 12 connected between the third FET 11 and a power supply VDD.

The transistor size of the first and second FETs 51 and 52 will now be considered.

Denoting the conduction resistances of the first and second FETs 51 and 52 by R51 and R52 and setting the same capacitance C30 and discharge time T as in the prior art example, from Equation (1) a relation $$R50=R51+R52 \qquad (4)$$

is obtained.

By setting the resistance R51 to 100 [Ω], i.e., 10% of the resistance R50, and the resistance R52 to the remaining 900 [Ω], like the prior art example the discharge time T is T=50 [nsec].

As for the transistor size of the first and second FETs 51 and 52, their gate widths should be about 500 and 55 [μm], respectively, in a 0.7 [μm] semiconductor process as in the prior art example.

The first and second delay circuits 61 and 62 each include an input stage constituted by an inverter having two, i.e., P- and N-channel, MOS FETs connected in series, an intermediate inverter 64 or 65 having an N-channel MOS FET, a resistor in series therewith and a delaying capacitor, and an output stage having two series inverters 63.

The delay time provided by the first delay circuit 61 is thus determined by the time constant of the resistance R64 of the series resistor and the capacitance C64 of the delaying capacitor. For example, it is 10 nsec. when the resistance R64 and capacitance C64 are set to 10 [kΩ] and 1 [pF], respectively.

The delay time provided by the second delay circuit 62 is, for instance, 15 [nsec] when the resistance R65 of the series resistor and the capacitance C65 of the delaying capacitor are set to 15 [kΩ] and 1 [Pf], respectively. In this case, a time difference of 5 [nsec] is provided with respect to the delay time provided by the first delay circuit 61.

In operation, when the input signal S1 vanishes after execution of the normal peak-holding function, the fourth FET is turned off. When the reset signal S2 is inverted to the level "H", the start of the resetting function is commanded.

With this inversion, the first and second FETs 51 and 52 are turned on, while the third FET 11 is continually held "on".

The holding capacitor 30 which has been charged, thus begins to be discharged, and the output voltage of the differential amplifier 10 is quickly reduced through the resultant resistance of the second and third FETs 51 and 11.

The resetting function is released as follows.

The releasing of the resetting function is started when the first delay circuit 61 inverts the first switching signal S3 to the level "L". At this time, the first FET 51 is turned off in advance.

Here, the second FET 52 is "on" and functions as a unity gain buffer. Thus, it can suppress noise due to the switching of the first FET 51, and the hold error is not affected.

The holding capacitor 30 is subsequently continually discharged slowly through the third FET 11, and the other operating points proceed toward the status that is necessary for the normal peak-holding function. Also, the source-drain potential V52 across the second FET 52 is brought to be about 1.8 [V].

When the second delay circuit 62 subsequently inverts the second switching signal S4 to the level "L", the second FET 52 is turned off. This instant is after the turning-off of the first FET 51.

At this instant, the drain-gate potential V53 across the second FET 52 connected to the holding capacitor 30 is about 3.2 [V], and the potential V52 becomes 60% or below of the potential V53. That is, the charge movement is 60% or below when the second FET 52 is turned off. It is thus possible to reduce the hold error.

The above embodiment is by no means limitative, and it is possible to detect the minimum level of the input signal S1 with the peak-holding circuit for burst communication. Various other changes and modifications are also possible without departing from the scope of the present invention.

As has been described in the foregoing, the peak-holding circuit for burst communication according to the present invention has the following effects.

Firstly, when discharging the holding capacitor in the execution of the resetting function, the first switching means which has a large gate width and offers low conduction resistance, starts quick discharge as in the prior art and is turned off in advance while the second switching means in parallel with it is "on". The second switching means thus provides a function of a unity gain buffer to suppress influence of noise generated at the time of the turning-off of the first switching means and permit hold error reduction.

Secondly, by setting the gate width of the second switching means to be smaller, the gate-drain parasitic capacitance thereof is reduced, and the source-drain potential on the second switch means is made to be lower than the gate-drain potential thereon. Thus, by turning off the second switching means after the first switching means has been turned on, the charge movement when the second switching means is turned off can be reduced to reduce the hold error.

Thirdly, the holding capacitor is continually discharged slowly by the differential amplifier output stage from the instant of turning-off of the first switching means till the instant of turning-off of the second switching means. Thus, the other operating points proceed toward a status necessary for the normal peak-holding function, and the source-drain potential on the second switch means is held to be lower than the gate-drain potential thereon.

As a result, a peak-holding circuit for burst communication, which can provide a quick resetting function and a highly accurate peak-holding function, is obtainable by providing slight additional means to a peak-holding circuit which is formed on a semiconductor integrated circuit.

What is claimed is:

1. A peak-holding circuit for burst communication comprising a differential amplifier having a normal phase input terminal with an input signal coupled thereto and an opposite phase input signal with an output signal coupled thereto, a forward diode for passing the output signal of the differential amplifier, a holding capacitor for holding the maximum level of the output signal passed through the diode with respect to the ground, a buffer for feeding back the maximum level that is held to the differential amplifier while providing the same as the output signal, a first switching means connected in parallel with the diode and to be turned on by a first switching signal for short-circuiting the diode, and a second switching means connected between the differential amplifier and the diode and to be turned on by a second switching signal for short-circuiting the holding capacitor via the first switching means.

2. The peak-holding circuit for burst communication according to claim 1, which further comprises a timing signal generating means for generating said first and second switching signals upon receipt of a reset signal and outputting these first and second switching signals to the first and second switching means, respectively.

3. The peak-holding circuit for burst communication according to claim 2, wherein the timing signal generating means includes a first delay circuit for generating the first switching signal by delaying the reset signal, and a second delay circuit for generating the second switching signal by delaying the reset signal.

4. The peak-holding circuit for burst communication according to claim 2, wherein the timing signal generating means generates the first and second switching signals such that the first switching signal is terminated before the termination of the second switching signal.

5. A peak-holding circuit for burst communication comprising a differential amplifier having a normal phase input terminal with an input signal coupled thereto and an opposite phase input signal with an output signal coupled thereto, a forward diode for passing the output signal of the differential amplifier, a holding capacitor for holding the maximum level of the output signal passed through the diode with respect to the ground, a first switching means connected in parallel with the diode and to be turned on by a first switching signal for short-circuiting the diode, and a second switching means connected between the differential amplifier and the diode and to be turned on by a second switching signal for short-circuiting the holding capacitor via the first switching means, the first and second switching signals being produced by delaying a reset signal and the first switching signal being terminated before the termination of the second switching signal.

* * * * *